United States Patent
Shibata

(10) Patent No.: US 8,076,656 B2
(45) Date of Patent: Dec. 13, 2011

(54) WRITING APPARATUS AND WRITING DATA CONVERSION METHOD

(75) Inventor: Hayato Shibata, Kanagawa (JP)

(73) Assignee: NuFlare Technology, Inc., Shizuoka (JP)

( * ) Notice: Subject to any disclaimer, the term of this patent is extended or adjusted under 35 U.S.C. 154(b) by 647 days.

(21) Appl. No.: 12/270,339

(22) Filed: Nov. 13, 2008

(65) Prior Publication Data

US 2009/0145751 A1 Jun. 11, 2009

(30) Foreign Application Priority Data

Dec. 11, 2007 (JP) .................................. 2007-319067

(51) Int. Cl.
*G06F 17/50* (2006.01)
*G01N 21/00* (2006.01)

(52) U.S. Cl. ............... 250/492.22; 250/492.2; 250/492.3

(58) Field of Classification Search ............... 250/492.2, 250/492.22, 492.3
See application file for complete search history.

(56) References Cited

U.S. PATENT DOCUMENTS

| | | | |
|---|---|---|---|
| 3,321,609 A * | 5/1967 | Bonney et al. ................ 341/78 |
| 4,470,140 A * | 9/1984 | Coffey ........................ 370/400 |
| 4,477,729 A * | 10/1984 | Chang et al. ............... 250/492.2 |
| 4,479,034 A * | 10/1984 | Brightman et al. ........... 379/255 |
| 4,743,766 A * | 5/1988 | Nakasuji et al. ........... 250/492.2 |
| 4,748,407 A * | 5/1988 | Brunner et al. ........... 324/754.22 |
| 4,853,870 A * | 8/1989 | Yasutake et al. ........... 250/396 R |
| 4,996,434 A * | 2/1991 | Tanaka ........................ 250/492.3 |
| 5,005,138 A * | 4/1991 | Tobuse et al. ............... 250/492.2 |
| 5,046,012 A * | 9/1991 | Morishita et al. ............. 700/121 |
| 5,105,284 A * | 4/1992 | Sakata et al. ................. 358/404 |
| 5,109,500 A * | 4/1992 | Iseki et al. ..................... 710/74 |
| 5,353,403 A * | 10/1994 | Kohiyama et al. ............. 345/563 |
| 6,851,078 B2 * | 2/2005 | Takano ........................ 714/718 |
| 7,067,830 B2 * | 6/2006 | Yoda et al. ................. 250/492.22 |
| 7,126,140 B2 * | 10/2006 | Yoda et al. ................. 250/492.22 |
| 7,514,660 B2 * | 4/2009 | Ikeda et al. .................. 250/201.2 |
| 7,710,634 B2 * | 5/2010 | Sandstrom .................... 359/290 |
| 7,872,745 B2 * | 1/2011 | Abe et al. ..................... 356/237.5 |
| 7,926,007 B2 * | 4/2011 | Shibata .......................... 716/55 |
| 7,973,918 B2 * | 7/2011 | Tsuchiya et al. ............ 356/237.1 |
| 2007/0069158 A1 * | 3/2007 | Ohnishi .................... 250/492.22 |
| 2009/0145751 A1 * | 6/2009 | Shibata ..................... 204/298.03 |
| 2011/0091099 A1 * | 4/2011 | Akiyama ....................... 382/162 |

FOREIGN PATENT DOCUMENTS

JP 2007-128933 5/2007

\* cited by examiner

*Primary Examiner* — David A Vanore
(74) *Attorney, Agent, or Firm* — Finnegan, Henderson, Farabow, Garrett & Dunner, L.L.P.

(57) ABSTRACT

A writing apparatus includes a storage unit configured to store writing data, an acquiring unit configured to acquire information on a pattern defined based on the writing data, a selecting unit configured to select a format of a plurality of formats having different number of bits to be used, based on acquired information on the pattern, for each predetermined region, a converting unit configured to convert data in the predetermined region defined by the writing data, by using a selected format, and a writing unit configured to write a predetermined pattern on a target workpiece, based on converted data in the predetermined region.

10 Claims, 10 Drawing Sheets

WRITING APPARATUS AND WRITING DATA CONVERSION METHOD

CROSS-REFERENCE TO RELATED APPLICATION

This application is based upon and claims the benefit of priority from the prior Japanese Patent Application No. 2007-319067 filed on Dec. 11, 2007 in Japan, the entire contents of which are incorporated herein by reference.

BACKGROUND OF THE INVENTION

1. Field of the Invention

The present invention relates to a pattern writing apparatus and a writing data conversion method. For example, it relates to a pattern writing apparatus which writes a predetermined pattern on a target workpiece using an electron beam, and a method for converting writing data to be processed in the writing apparatus.

2. Description of Related Art

The lithography technique that advances microscaling of semiconductor devices is extremely important as being the only process to form patterns in semiconductor manufacturing processes. In recent years, with high integration of large-scale integrated circuits (LSI), critical dimensions required for semiconductor device circuits are shrinking year by year. In order to form a desired circuit pattern on semiconductor devices, a master pattern (called a mask or a reticle) of high precision is required. The electron beam intrinsically having excellent resolution is used for producing such highly precise master patterns.

FIG. 10 is a schematic diagram illustrating operations of a variable-shaped electron beam (EB) type pattern writing apparatus. As shown in the figure, the variable-shaped electron beam writing apparatus, including two aperture plates, operates as follows: A first aperture plate 410 has a rectangular opening or "hole" 411 for shaping an electron beam 330. This shape of the rectangular opening may also be a square, a rhombus, a rhomboid, etc. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which is continuously moves in one predetermined direction (e.g. X direction) during the writing or "drawing." In other words, a rectangular shape formed as a result of passing through both the opening 411 and the variable-shaped opening 421 is written in the writing region of the target workpiece 340 on the stage. This method of forming a given shape by letting beams pass through both the opening 411 and the variable-shaped opening 421 is referred to as a "variable shaped" method.

When performing the electron beam writing as mentioned above, first, layout of a semiconductor integrated circuit is designed, and layout data (design data), in which pattern layout is defined, is generated. Then, the layout data is converted into writing data which is adapted to the electron beam writing apparatus. The writing data is input into the writing apparatus, and, after plural data processing operations, generated as shot data to be used at the time of writing (refer to e.g., Japanese Patent Application Laid-open (JP-A) No. 2007-128933). Writing processing is performed based on the shot data. In the pattern writing apparatus, first, the writing data is developed into intermediate data before the shot data being generated. Conventionally, the pattern data format has been designed to respond to all possible sizes, coordinates, figure types, and the number of figures. Therefore, in the conventional pattern data format, the number of bits capable of responding to any of these is prepared.

However, depending on the layout of the writing data, there is a case of using only a part of the number of bits prepared in the conventional pattern data format. For example, in the case of the layout where patterns of the same figure or the same size are mainly repeatedly used, only a few numbers of bits prepared in the conventional pattern data format are used. When only several patterns in one layout have such a case of only a few numbers of bits being used, they won't have much influence. However, with the recent trend of pattern miniaturization and pattern number increase, patterns using only a few numbers of bits are increasing. Therefore, if the numbers of bits which are not used are accumulated, it will become a bit number corresponding to a data size not to be disregarded for the throughput of the apparatus.

As mentioned above, in the pattern data format conventionally used, the number of bits capable of responding to all possible sizes, coordinates, figure types, and the number of figures is prepared. Therefore, there are many unused bits, so that if the numbers of the unused bits are accumulated, it will be a bit number corresponding to a data size not to be disregarded for the throughput of the apparatus. As reducing the data size is requested with the recent trend of pattern miniaturization and pattern number increase, it is an issue how to reduce the number of bits which are not used.

BRIEF SUMMARY OF THE INVENTION

It is an object of the present invention to provide a writing apparatus and a writing data conversion method in and by which the number of useless bits is decreased to reduce the data size.

In accordance with one aspect of the present invention, a writing apparatus includes a storage unit configured to store writing data, an acquiring unit configured to acquire information on a pattern defined based on the writing data, a selecting unit configured to select a format of a plurality of formats having different number of bits to be used, based on acquired information on the pattern, for each predetermined region, a converting unit configured to convert data in the predetermined region defined by the writing data, by using a selected format, and a writing unit configured to write a predetermined pattern on a target workpiece, based on converted data in the predetermined region.

In accordance with another aspect of the present invention, a method for converting writing data includes inputting writing data, acquiring information on a pattern defined based on the writing data, selecting a format of a plurality of formats having different number of bits to be used, based on acquired information on the pattern, for each predetermined region, converting data in the predetermined region defined by the writing data, by using a selected format, and storing converted data in the predetermined region.

DETAILED DESCRIPTION OF THE INVENTION

In the following Embodiment, a structure utilizing an electron beam as an example of a charged particle beam will be described. The charged particle beam is not necessarily limited to the electron beam. Another charged particle beam, such as an ion beam, may also be used. Moreover, as an example of a charged particle beam apparatus, there will be described a charged particle beam writing apparatus, especially a variable shaped type electron beam writing apparatus.

Embodiment 1

Figure 1:
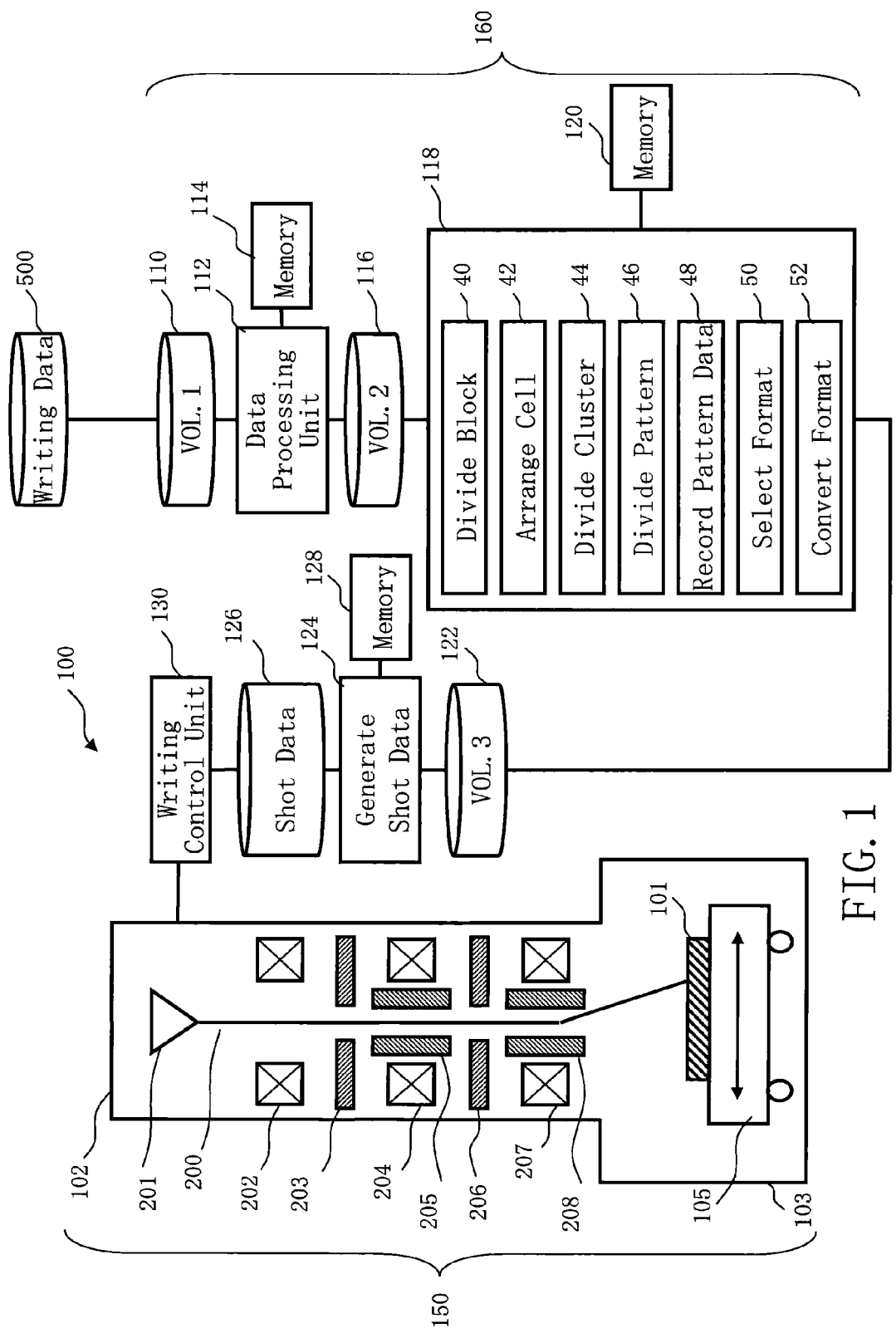
FIG. 1 is a schematic diagram showing a structure of a pattern writing apparatus according to Embodiment 1.

FIG. 1 is a schematic diagram illustrating the structure of a pattern writing apparatus according to Embodiment 1. In FIG. 1, a pattern writing apparatus 100 is an example of an electron beam pattern writing apparatus. The pattern writing apparatus 100 writes a pattern composed of a plurality of figures onto a target workpiece 101. The target workpiece 101 includes a mask to be used in the lithography step of manufacturing semiconductor devices. The pattern writing apparatus 100 includes a writing unit 150 and a control unit 160. The writing unit 150 includes a writing chamber 103 and an electron lens barrel 102 arranged above the writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is an XY stage 105 on which the target workpiece 101 serving as a writing target is placed. The control unit 160 includes magnetic disk drives 110, 116, 122, and 126, a data processing unit 112, memories 114, 120, and 128, a control computer 118, a shot data generating unit 124, and a writing control unit 130. The magnetic disk drives 110, 116, 122 and 126, the data processing unit 112, the memories 114, 120 and 128, the control computer 118, the shot data generating unit 124, and the writing control unit 130 are mutually connected by buses (not shown). In the control computer 118, there are arranged a block division unit 40, a cell arranging unit 42, a cluster division unit 44, a pattern division unit 46, a pattern data recording unit 48, a format selecting unit 50, and a format converting unit 52. The magnetic disk drives 110, 116, 122 and 126 and the memories 114, 120 and 128 are examples of a storage unit or a storage device. Moreover, writing data is stored in an external magnetic disk drive 500.

The block division unit 40, the cell arranging unit 42, the cluster division unit 44, the pattern division unit 46, the pattern data recording unit 48, the format selecting unit 50, and the format converting unit 52 may be configured as processing functions executable by a computer, such as a CPU, that executes a program, or configured by hardware of an electric circuit. Alternatively, they may be executed by a combination of hardware of an electric circuit and software, or a combination of the hardware and firmware. When executed by software or combination with the software, each data to be input into the computer which performs processing, or each data being or having been processed is stored in the memory 120 each time. Similarly, the data processing unit 112 and the shot data generating unit 124 may be configured as processing functions executable by a computer, such as a CPU, that executes a program, or configured by hardware of an electric circuit. Alternatively, they may be executed by a combination of hardware of an electric circuit and software, or a combination of the hardware and firmware. When executed by software or combination with software, each data to be input into the computer which performs processing, or each data being or having been processed is stored in the memory 114 for the data processing unit 112, and in the memory 128 for the shot data generating unit 124 each time.

Moreover, the data processing unit 112, the control computer 118, and the shot data generating unit 124 can be configured by one computer or plural computers, respectively. A parallel processing can be performed by being configured by plural computers, and thereby increasing the processing speed.

FIG. 1 shows structure elements necessary for explaining Embodiment 1, it should be understood that other structure elements generally necessary for the pattern writing apparatus 100 may also be included.

Figure 2:
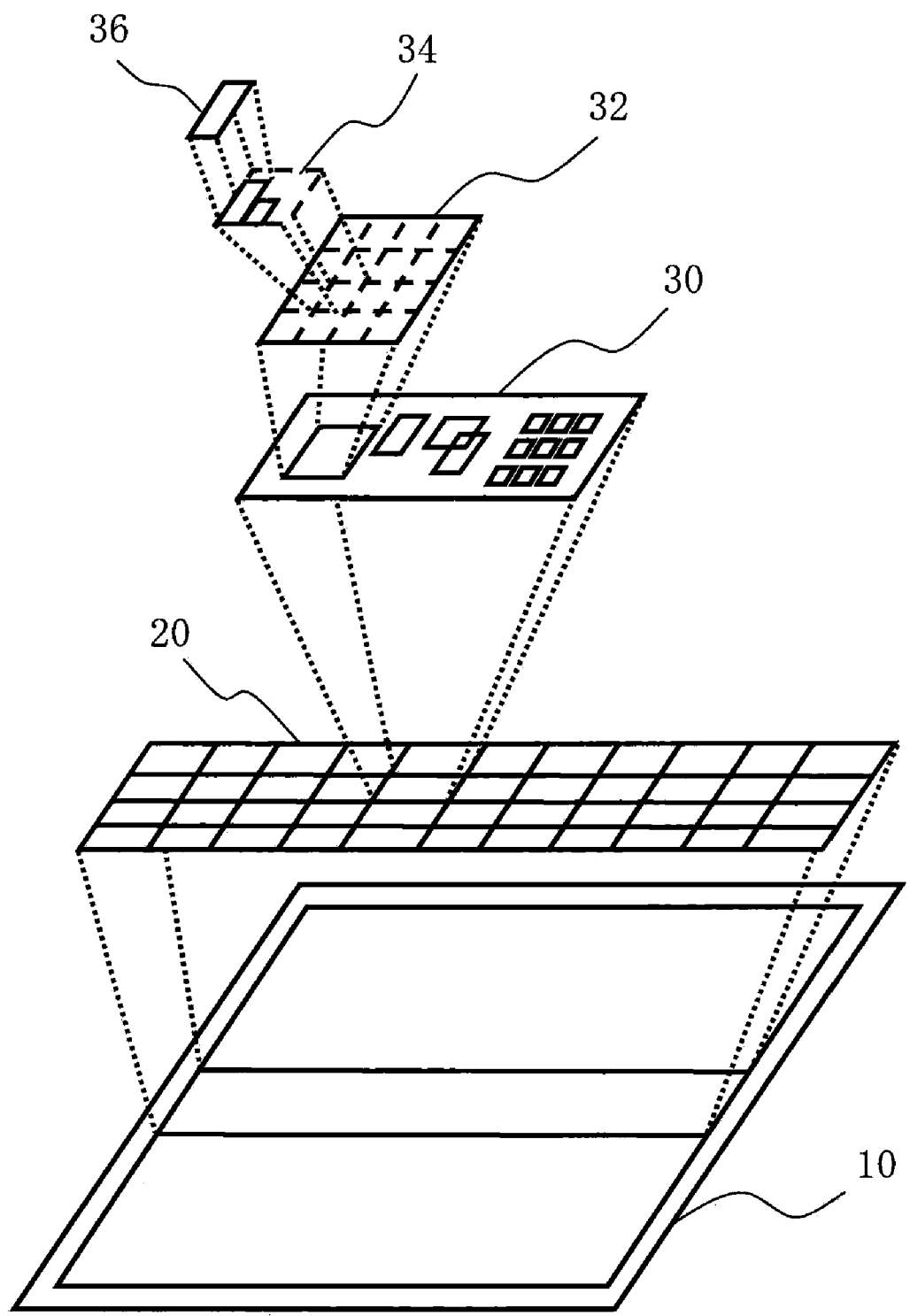
FIG. 2 shows an example of a hierarchical structure of writing data according to Embodiment 1.

FIG. 2 shows an example of a hierarchical structure of writing data according to Embodiment 1. In the writing data, a writing region or "writing area" has a hierarchical structure composed of a series of plural internal configuration units, such as a layer of a chip 10, a layer of a stripe 20 formed by virtually dividing the chip region into a plurality of strip-like portions in a certain direction, for example, the Y-axis direction, a layer of a block 30 formed by dividing the stripe 20, a layer of a cell 32 composed of at least one or more figures, a layer of a cluster 34 formed by dividing the cell 32, and a layer of a figure (pattern) 36 which is arranged in the cluster 34 and constitutes the cell 32. Generally, a plurality of chips are laid out in the writing region of one target workpiece 101. Therefore, in the data processing unit 112 mentioned later, chip merging is performed to configure a hierarchy as shown in FIG. 2. While the stripe 20 is herein formed by dividing the chip region into a plurality of strip-like portions arrayed in the Y-axis direction (predetermined direction) as an example, it may be divided into portions parallel to the drawing surface and arrayed in the direction of X-axis orthogonal to the Y-axis. Alternatively, it may be other direction parallel to the drawing surface.

Figure 3:
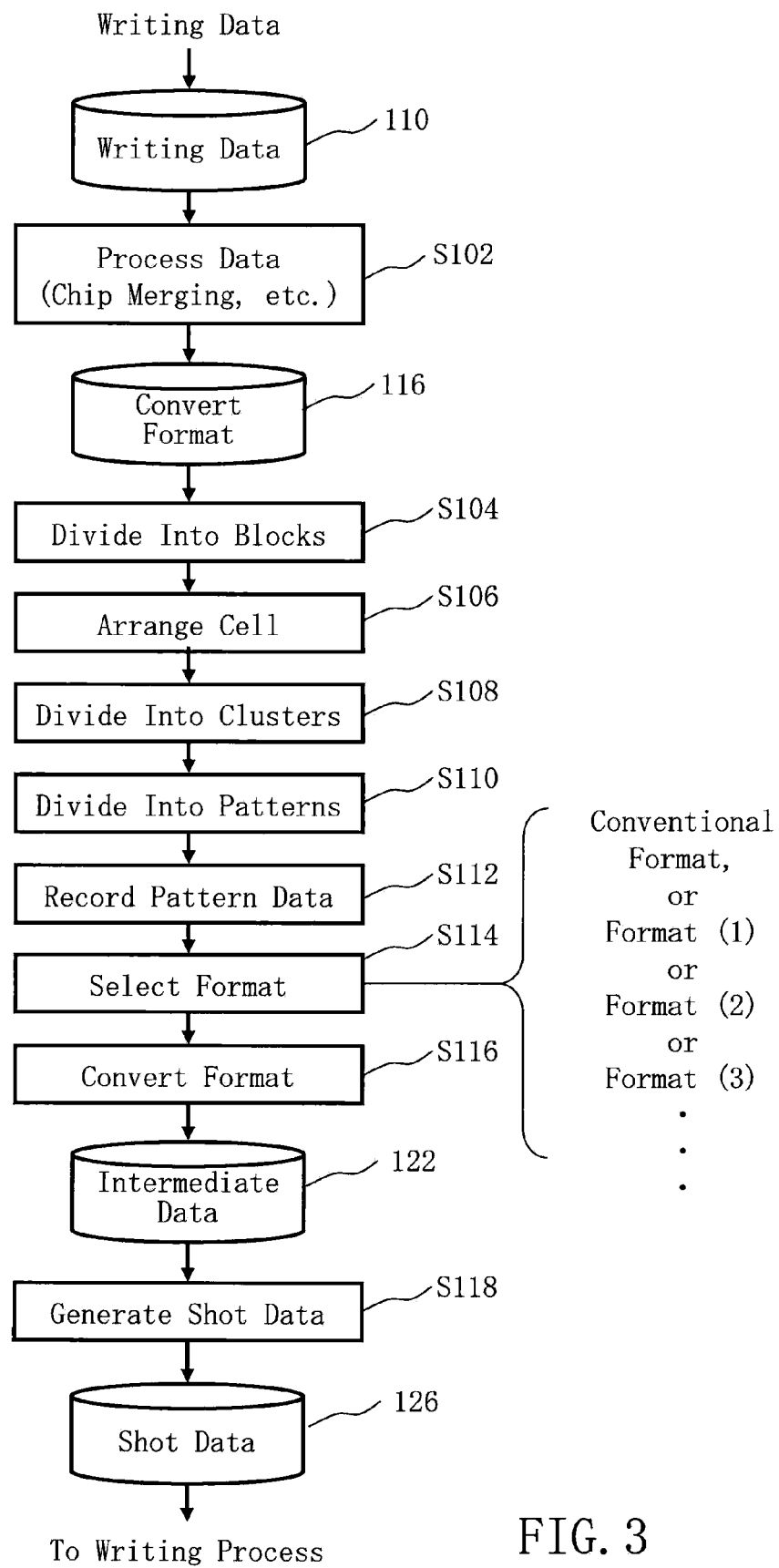
FIG. 3 is a flowchart showing a writing method according to Embodiment 1.

FIG. 3 is a flowchart showing a writing method according to Embodiment 1. As mentioned above, when writing with an electron beam, it starts with designing a layout of a semiconductor integrated circuit. Then, layout data (design data) in which pattern layout is defined is generated. The layout data is converted into writing data adapted to be input into the writing apparatus 100. The writing data is read from the magnetic disk drive 500, input into the writing apparatus 100, and stored in the magnetic disk drive 110. After a plurality of data processing as mentioned later, the writing data is generated as shot data used at the time of writing.

In the step S102, as a data processing step, the data processing unit 112 reads and inputs each wring data of a plurality of chips from the magnetic disk drive 110. The data processing unit 112 rearranges the each writing data in the writing region of the pattern writing apparatus 100, and performs chip merging. Moreover, in addition to this, the data processing unit 112 may perform data processing, such as mirroring and scaling. After being processed as mentioned above, the writing data is stored in the magnetic disk drive 116.

In the step S104, as a step of dividing into blocks, the block division unit 40 develops the writing data, which has been data processed in the prior step, to virtually divide the chip 10 or each stripe 20 into a plurality of blocks 30 as shown in FIG. 2.

In the step S106, as a cell arrangement step, the cell arranging unit 42 further develops the writing data in order to arrange the laid out cell 32 in each block 30.

In the step S108, as a step of dividing into clusters, the cluster division unit 44 further develops the writing data in order to virtually divide each cell 32 into a plurality of clusters 34 as shown in FIG. 2.

In the step S110, as a step of dividing into patterns, the pattern division unit 46 further develops the writing data in order to divide each cluster 34 into a plurality of figures 36 (patterns) laid out in each cluster 34 as shown in FIG. 2. The pattern division unit 46 can acquire pattern data (pattern information) such as the number, types, sizes (L, M) and arrangement coordinates (X, Y) of the figures 36 in each cluster 34 by performing pattern division. Thus, the pattern division unit 46 can acquire information on the pattern defined based on the writing data. The pattern division unit 46 serves as an example of an acquiring unit.

In the step S112, as a pattern data recording step, the pattern data recording unit 48 records (stores) the acquired pattern data such as the number, types, sizes (L, M) and arrangement coordinates (X, Y) of the figure 36 with respect to each cluster 34, into the memory 120. In addition, information on a plurality of formats, such as a conventional format, a format (1), a format (2), a format (3), and so on, which are used in a format conversion mentioned later, is stored in the memory 120. Each of these formats is configured to have a different bit number to be used each other.

In the step S114, as a format selection step, the format selecting unit 50 selects one of a plurality of formats based on the acquired pattern data for each cluster 34 (predetermined region). The format selecting unit 50 selects a format based on pattern information of at least one of the number, type, and size of the figure 36. For example, the format (1) is selected for the cluster 34 whose pattern number is larger than a predetermined threshold value. The format (2) is selected for the cluster 34 in which only rectangular patterns composed of only right angles, such as a square or a rectangle, are arranged. For example, the format (3) is selected for the cluster 34 in which a large number of small patterns, such as a contact hole pattern, are arranged. Then, the conventional format is selected for the cluster 34 in which patterns other than the above ones are arranged. Thus, the format selecting unit 50 selects one of a plurality of formats for each cluster 34 based on a predetermined reference.

In the step S116, as a format conversion step, the format converting unit 52 converts data in the cluster 34 defined by the writing data, based on the selected format. By converting the format of the writing data, intermediate data being a preliminary step to shot data can be generated.

Figure 4:
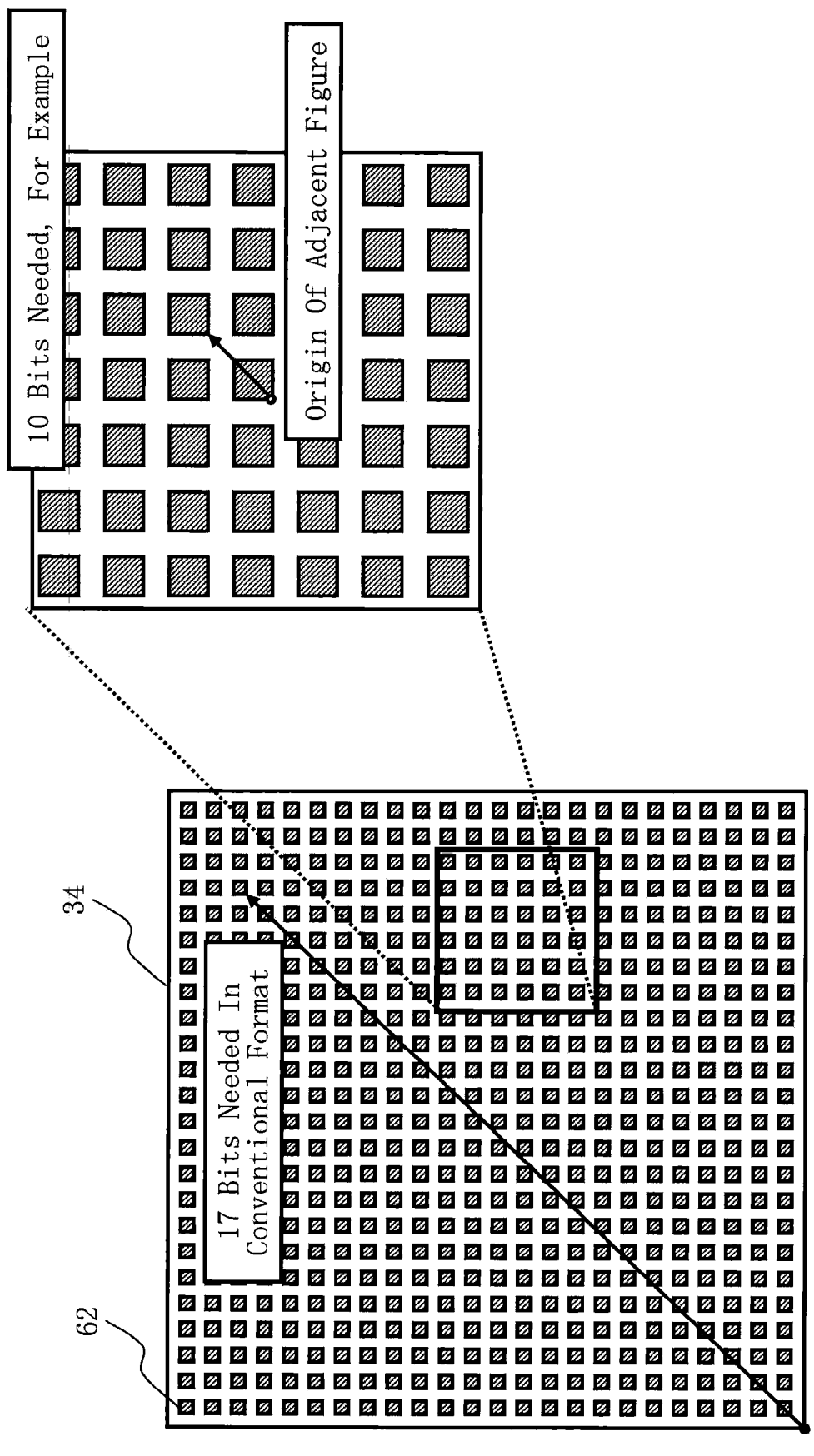
FIG. 4 shows an example of a cluster according to Embodiment 1, in which a large number of patterns are arranged.

FIG. 4 shows an example of a cluster according to Embodiment 1, in which a large number of patterns are arranged. FIG. 4 shows the case where a large number of small-sized figures 62 are arranged. Since the figure size is small in such a layout, the number of bits indicating the size of the figure can also be reduced. For example, 17 bits for the size L and 17 bits for the size M, totally 34 bits, are needed in the conventional format, whereas 10 bits for the size L and 10 bits for the size M, totally 20 bits, are needed in the layout shown in FIG. 4. Since 14 bits can be reduced for the figure size (L, M) with respect to one figure 62, when the reduced amounts are accumulated for all the figures 62, it becomes possible to reduce an immense number of bits in the whole writing data. With regard to the figure coordinates (X, Y) for arranging the figure 62, the coordinates from the origin (reference position) of the cluster 34 are conventionally used. However, since the distance between figures is short in the layout shown in FIG. 4, it is also preferable to use coordinates from the origin of the adjacent figure 62, instead of using the cluster origin as the reference position. This makes it possible to reduce the bit number to 11 bits for X and 11 bits for Y, totally 22 bits for example, in the layout shown in FIG. 4 when defining the coordinates (X, Y), while 17 bits for X and 17 bits for Y, totally 34 bits for example, are needed in the conventional format. Since 12 bits can be reduced for the coordinates (X, Y) with respect to one figure 62, it becomes possible to reduce a large number of bits even by merely accumulating such reduced amounts of all the figures 62 in the cluster. Furthermore, if there are many layouts similar to this, an immense number of bits can be reduced in the whole writing data.

Figure 5:
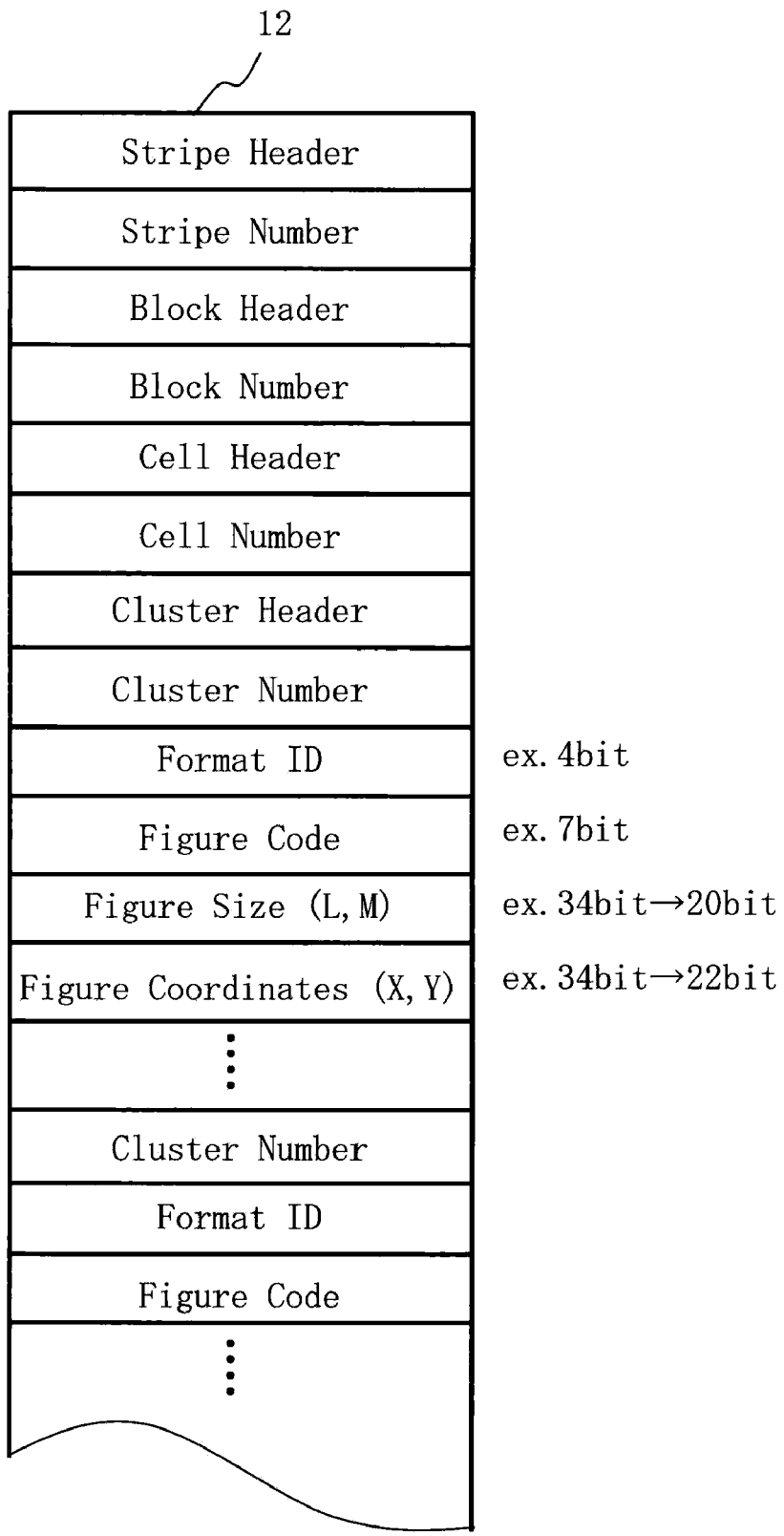
FIG. 5 shows an example of intermediate data converted according to a format (1) in Embodiment 1.

FIG. 5 shows an example of intermediate data converted according to the format (1) in Embodiment 1. In intermediate data 12 of FIG. 5, which has been converted based on the format (1), a stripe header and a stripe number, and further a block header and a block number relating to block data located in the stripe concerned are defined in order. Following the block number, a cell header and a cell number relating to cell data arranged in the block concerned, and a cluster header and a cluster number relating to cluster data arranged in the cell concerned are defined. Then, following the cluster number, an identifier (format ID) for identifying the format (1) used for the conversion is defined. By assigning 4 bits, for example, to a format ID, it becomes possible to define the format ID to be identifiable. Following the format ID, a figure code, a figure size (L, M), and figure coordinates (X, Y) are defined. Then, following the first figure coordinates (X, Y), a figure code, a figure size (L, M), and figure coordinates (X, Y) of the second figure 62 arranged in the same cluster 34 are defined. In this way, when the entire figures in one cluster 34 have been defined, a cluster header and a cluster number of the next cluster 34 are followingly defined. After this, defining is performed similarly.

The format (1) is designed to secure, for example, 10 bits for L and 10 bits for M, totally 20 bits, for defining the figure size (L, M). In addition, it is designed to secure, for example, 11 bits for X and 11 bits for Y, totally 22 bits, for defining the coordinates (X, Y). Compared with the conventional format in which 17 bits for L and 17 bits for M, totally 34 bits for example, are needed for defining the figure size (L, M), and 17 bits for X and 17 bits for Y, totally 34 bits for example, are needed for defining the coordinates (X, Y), it becomes possible to reduce 26 bits for one figure by using the format (1).

It is preferable herein that a condition is set for the format selecting unit 50 as a reference for selecting the format (1), such as the condition that the number of figures (the number of patterns) arranged in the cluster 34 is more than a predetermined threshold value, for example, 3000. Owing to the intermediate data being generated in the format (1), the number of bits for the figure size (L, M) and the coordinates (X, Y) can be reduced.

Figure 6:
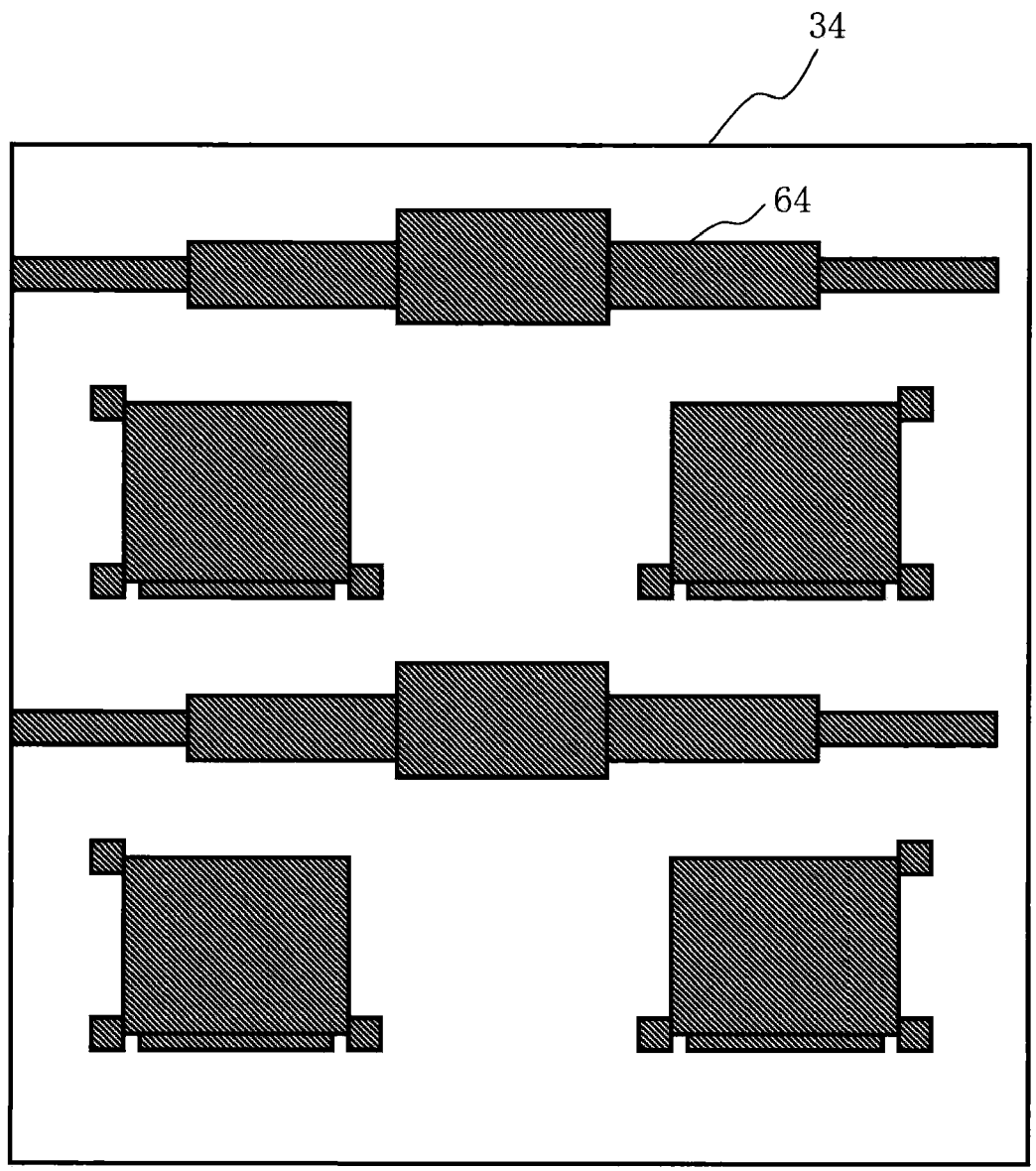
FIG. 6 shows an example of a cluster according to Embodiment 1, in which only rectangular patterns are arranged.

FIG. 6 shows an example of a cluster according to Embodiment 1, in which only rectangular patterns are arranged. FIG. 6 shows the case where only rectangular figures 64 composed of only right angles, such as a square or a rectangle, are arranged. Since defining a figure code indicating a figure type is not needed in such a layout, it is possible to do without the number of bits of figure codes. For example, while 7 bits are needed for defining a figure code in the conventional format, the bit number can be reduced to zero in the layout shown in FIG. 6. Since 7 bits can be reduced for a figure code with respect to one figure 64, when the reduced amounts are accumulated for all the figures 64, it becomes possible to reduce an immense number of bits in the whole writing data.

Figure 7:
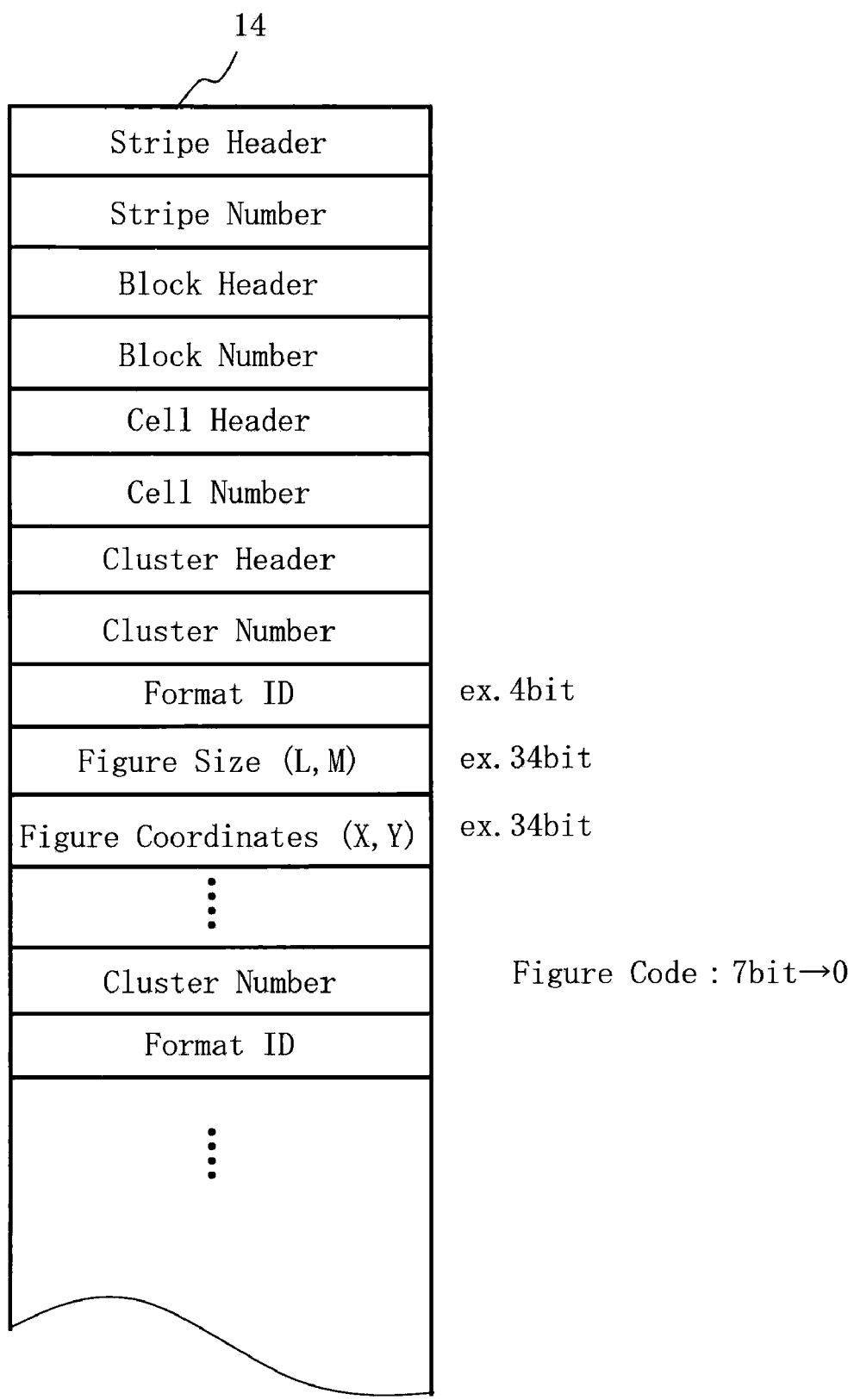
FIG. 7 shows an example of intermediate data converted according to a format (2) in Embodiment 1.

FIG. 7 shows an example of intermediate data converted according to the format (2) in Embodiment 1. Intermediate data 14 of FIG. 7, which has been converted based on the format (2), is defined similarly to the intermediate data 12 from the stripe header to the format ID. Then, following the format ID, a figure size (L, M), and figure coordinates (X, Y) are defined. Following the first figure coordinates (X, Y), a figure size (L, M), and figure coordinates (X, Y) of the second figure 62 arranged in the same cluster 34 are defined. In this way, when the entire figures in one cluster 34 have been defined, a cluster header and a cluster number of the next cluster 34 are followingly defined. After this, defining is performed similarly.

The format (2) is designed to do without bits for defining figure codes. Compared with the conventional format in which, for example, 7 bits are needed for defining a figure code, it is possible to reduce 7 bits for each figure by using the format (2).

It is preferable herein that a condition is set for the format selecting unit 50 as a reference for selecting the format (2), such as the condition that the figure type arranged in the cluster 34 is a rectangle only. Owing to the intermediate data being generated in the format (2), the number of bits for the figure code can be reduced.

Figure 8:
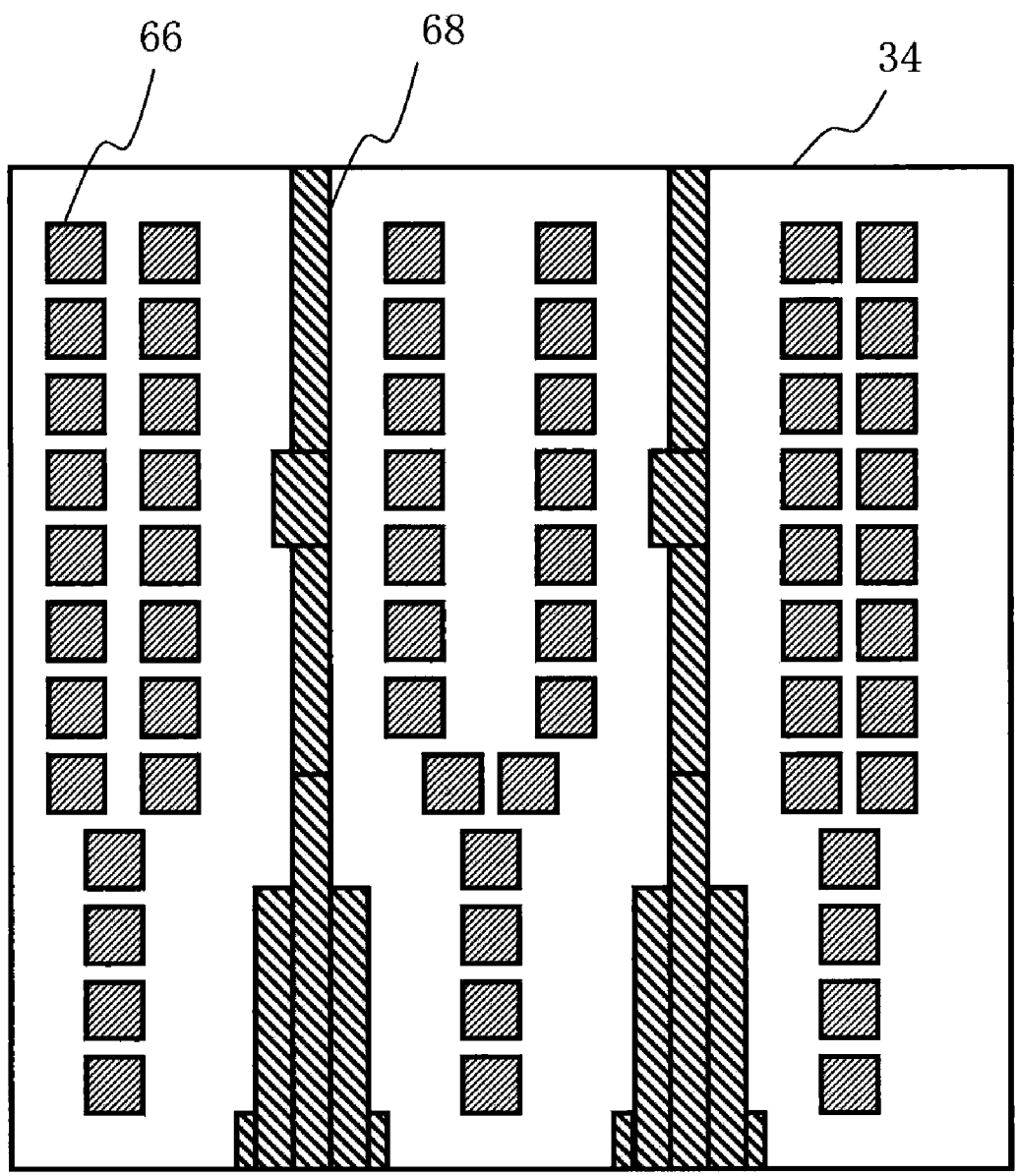
FIG. 8 shows an example of a cluster according to Embodiment 1, in which contact patterns are arranged.

FIG. 8 shows an example of a cluster according to Embodiment 1, in which contact patterns are arranged. FIG. 8 shows the case where there are arranged a large number of figures 66 being small-sized contact hole patterns. The same figures are often repeated in such a layout compared with a figure 68 being a wiring pattern, etc. Therefore, the figure size can be limited to some types, thereby defining the figure size by using figure size codes instead of using the sizes of L and M. For example, figure size codes are a bit value "0" for $L_1$ and $M_1$, a bit value "1" for $L_2$ and $M_2$, and a bit value "2" for $L_3$ and $M_3$. Thus, the number of bits indicating the figure size can also be reduced. For example, 17 bits for L and 17 bits for M, totally 34 bits, are needed for defining figure sizes L and M in the conventional format, whereas it can be reduced to 3 bits, for example, in the layout shown in FIG. 8 as mentioned above. Since 31 bits can be reduced for the figure size (L, M) of one figure of the figure 66 or the figure 68, when the reduced amounts are accumulated for all the figures, it becomes possible to reduce an immense number of bits in the whole writing data.

Similarly, the figure type can also be limited to some types in the layout shown in FIG. 8. Therefore, the number of bits for the figure code can be reduced. While 7 bits, for example, are needed for defining a figure code in the conventional format, it is possible to reduce the bit number to 3 bits when defining the figure type to be three types corresponding to the three figure sizes mentioned above in the layout shown in FIG. 8. Since 4 bits can be reduced for the figure code of one figure of the figure 66 or the figure 68, when the reduced amounts are accumulated for all the figures, it becomes possible to reduce an immense number of bits in the whole writing data.

Figure 9:
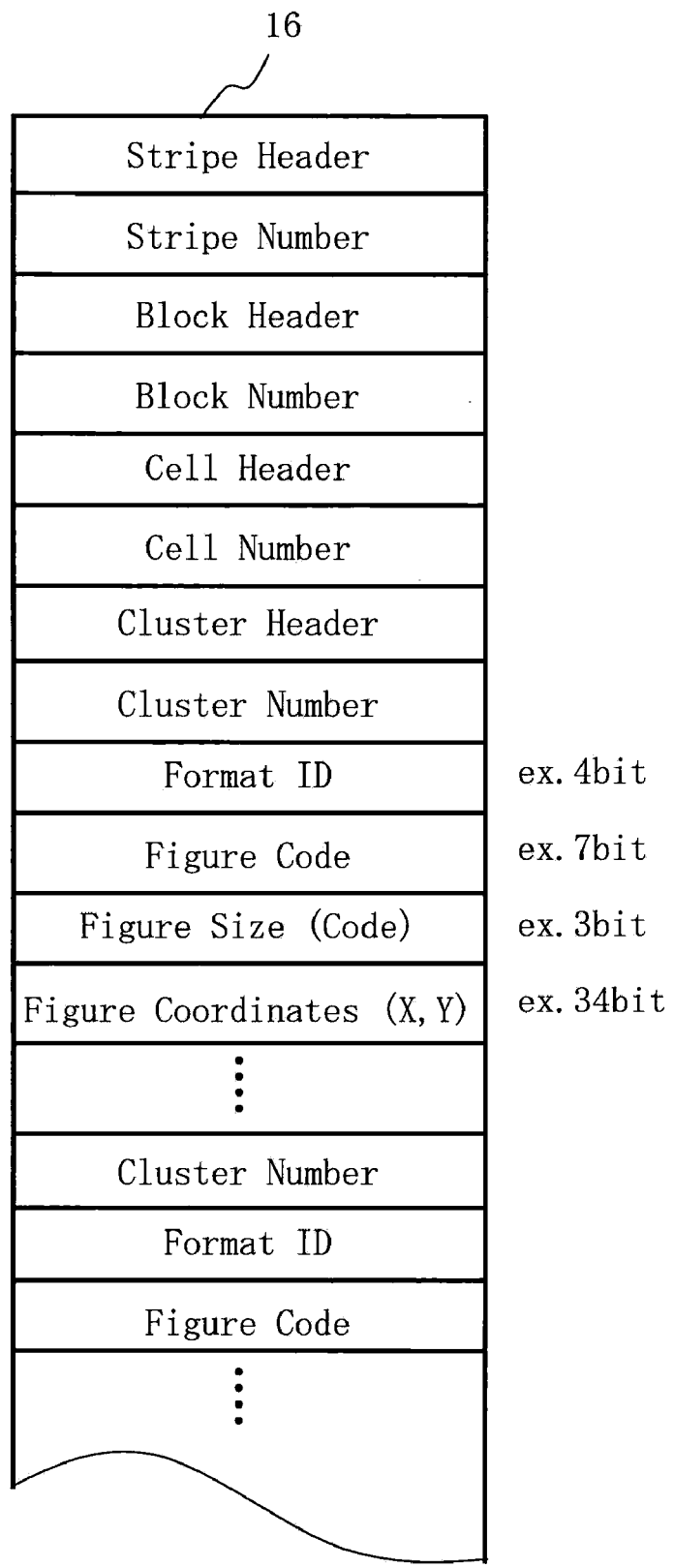
FIG. 9 shows an example of intermediate data converted according to a format (3) in Embodiment 1.
Figure 10:
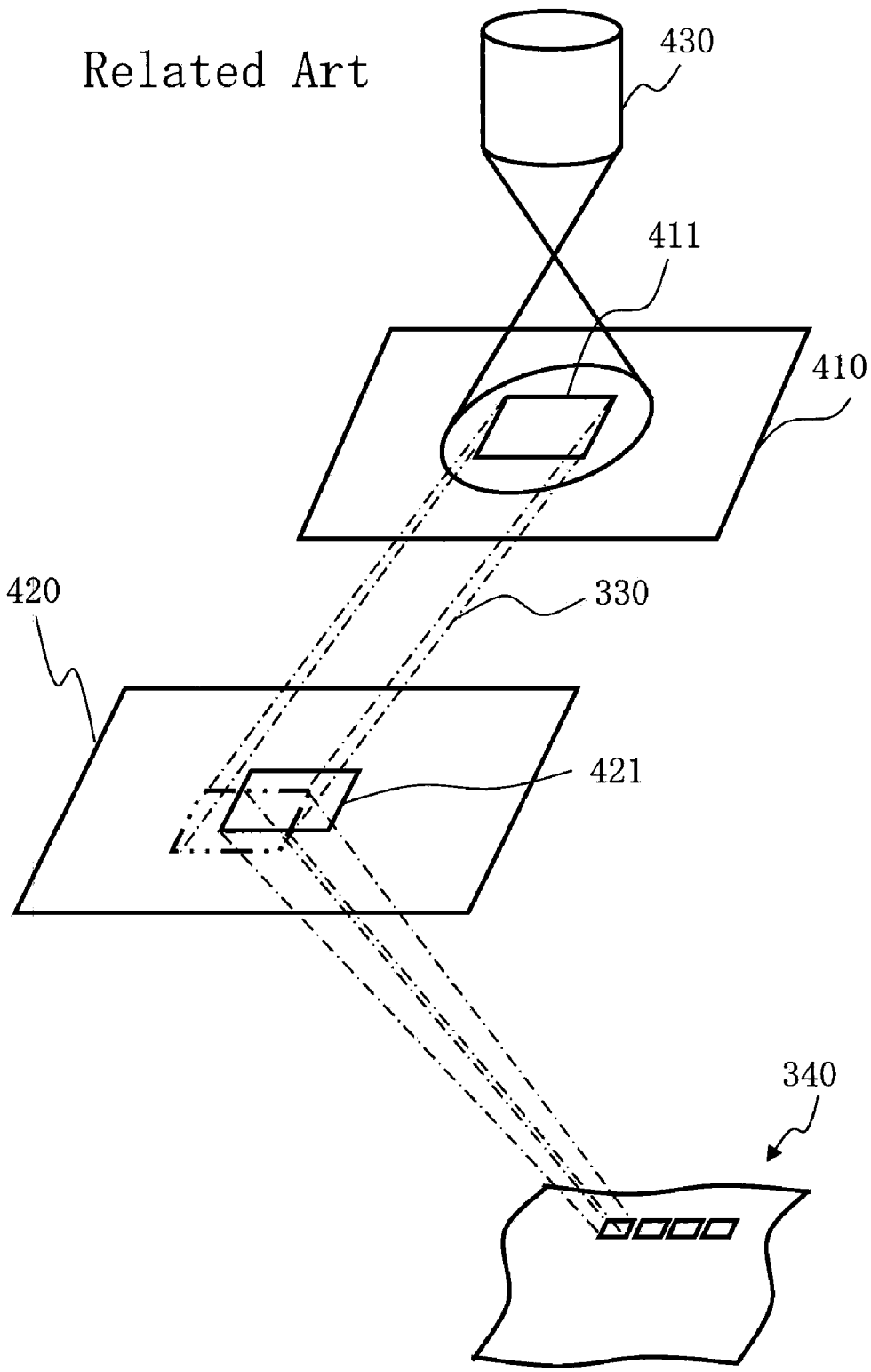
FIG. 10 is a schematic diagram illustrating operations of a variable-shaped electron beam type pattern writing apparatus.

FIG. 9 shows an example of intermediate data converted according to the format (3) in Embodiment 1. Intermediate data 16 of FIG. 9, which has been converted based on the format (3), is defined similarly to the intermediate data 12 from the stripe header to the format ID. Then, following the format ID, a figure code, a figure size code, and figure coordinates (X, Y) are defined. Following the first figure coordinates (X, Y), a figure code, a figure size code, and figure coordinates (X, Y) of the second figure 62 arranged in the same cluster 34 are defined. In this way, when the entire figures in one cluster 34 have been defined, a cluster header and a cluster number of the next cluster 34 are followingly defined. After this, defining is performed similarly.

The format (3) is defined to secure 3 bits for defining a figure size code, for example. In addition, it is designed to secure 3 bits for defining a figure code, for example. Compared with the conventional format in which 17 bits for L and 17 bits for M, totally 34 bits for example, are needed for defining the figure size (L, M), and 7 bits, for example, are needed for defining a figure code, it becomes possible to reduce 35 bits for one figure by using the format (3). It is further preferable to store a corresponding table which indicates the bit value "0" corresponds to $(L_1, M_1)$, the bit value "1" does to $(L_2, M_2)$, and the bit value "2" does to $(L_3, M_3)$ in the memory 120, etc.

It is preferable herein that a condition is set for the format selecting unit 50 as a reference for selecting the format (3), such as the condition that the size of the figure arranged in the cluster 34 is 1/A, for example 1/100, of the cluster size, and the number of the figures arranged in the cluster 34 is B, for example 100 or more. Owing to the intermediate data being generated in the format (3), the number of bits for the figure size (L, M) and the figure code can be reduced.

As mentioned above, the format selecting unit 50 selects a format based on pattern information of at least one of the number, type, and size of the figure. However, when selecting one of formats, it is not limited to the references mentioned above. It is preferable that the format selecting unit 50 selects a format so that the number of bits to be used by the data after conversion in the cluster may be fewer.

As mentioned above, the intermediate data in each cluster, whose number of bits has been greatly reduced as a result of the conversion, is memorized (stored) in the magnetic disk drive 122.

In the step S118, as a shot data generating step, the shot data generating unit 124 reads the intermediate data from the magnetic disk drive 122 to generate shot data. Concretely, the shot data generating unit 124 refers to a format ID defined in the read intermediate data, develops the intermediate data based on the format, and divides each figure into shot figures. The shot data generated as mentioned above is stored in the magnetic disk drive 126.

Then, the writing unit 150 writes a predetermined pattern on the target workpiece 101 as follows by using an electron beam 200 controlled by the shot data based on data in the cluster converted on the basis of a plurality of formats described above. The writing unit 150 is controlled by the writing control unit 130.

The electron beam 200 emitted from the electron gun assembly 201 irradiates the entire first aperture plate 203 having an opening or "hole" in the shape of a rectangle by using the illumination lens 202. At this point, the electron beam 200 is shaped to be a rectangle. Such a rectangular shape may be a square, rhombus, rhomboid, etc. Then, after having passed through the first shaping aperture plate 203, the electron beam 200 of a first aperture image is projected onto the second aperture plate 206 by the projection lens 204. The position of the first aperture image on the second aperture plate 206 is controlled by the deflector 205, and the shape and size of the beam can be changed. After having passed through the second aperture plate 206, the electron beam 200 of a second aperture image is focused by the objective lens 207 and deflected by the deflector 208 to reach a desired position on the target workpiece 101 placed on the XY stage 105 which is movably arranged.

Here, the effect of reducing the number of bits is verified using one of the formats mentioned above. According to the ITRS (International Technology Roadmap for Semiconductor) report, the current layout design uses a half pitch (HP) of 65 nm. Based on this, the verification will be performed using a cluster in which figures of 80 nm being the minimum pattern size are simply arrayed at a pitch of 160 nm. The cluster size is supposed to be 12.8 μm, and the format (1) mentioned above is used in this case. While 17 bits for L and 17 bits for M, totally 34 bits, are needed for defining the figure size (L, M) in the conventional format, it is possible to reduce the bit number to 10 bits for L and 10 bits for M, totally 20 bits by using the format (1). In addition, while 17 bits for X and 17 bits for Y, totally 34 bits, are needed for defining coordinates (X, Y) in the conventional format, it is possible to reduce the bit number to 11 bits for X and 11 bits for Y, totally 22 bits, by using the format (1). Thus, while 68 bits are needed in the conventional format, it is possible to reduce the bit number to 42 bits in the format (1). Therefore, the amount of date in this cluster can be reduced by $1-42/68=0.38$, namely 38%.

As mentioned above, by preparing several formats having different number of bits to be used, it becomes feasible to select the format in which the number of bits required in accordance with the layout of writing data is secured. Therefore, the number of bits not being used can be reduced in the data in a predetermined region having been converted. Owing to selecting a format for each predetermined region, the effects of reducing the number of bits are accumulated, thereby greatly reducing the number of bits not being used with respect to the entire regions.

According to the present Embodiment as mentioned above, since the format to be used for converting into intermediate data can be selected from a plurality of formats, it is feasible to greatly reduce the number of bits of the intermediate data. As a result, the data size of the intermediate data can be reduced and the writing time can be greatly shortened. Thus, the throughput of the apparatus can be increased extremely.

While the embodiments have been described above with reference to specific examples, the present invention is not limited to these specific ones. For example, although the format is selected for each cluster, it is not limited thereto. For example, the format may be selected for each cell.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other apparatus and method for generating writing data, apparatus and method for converting writing data, and apparatus and method for writing with a charged particle beam that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A writing apparatus comprising:
   a storage unit configured to store writing data;
   an acquiring unit configured to acquire information on a pattern defined based on the writing data;
   a selecting unit configured to select a format of a plurality of formats having different number of bits to be used, based on acquired information on the pattern, for each predetermined region;
   a converting unit configured to convert data in the predetermined region defined by the writing data, by using a selected format; and
   a writing unit configured to write a predetermined pattern on a target workpiece, based on converted data in the predetermined region.

2. The apparatus according to claim 1, wherein the selecting unit selects the format based on at least one piece of pattern information of a figure type, number of figures, and a figure size.

3. The apparatus according to claim 1 wherein, in the converted data in the predetermined region, an identifier for identifying the format used for converting is defined.

4. The apparatus according to claim 3, wherein the selecting unit selects the format based on at least one piece of pattern information of a figure type, number of figures, and a figure size.

5. The apparatus according to claim 1, wherein the selecting unit selects the format so that number of bits to be used by the converted data in the predetermined region is to be fewer.

6. A method for converting writing data comprising:
   inputting writing data;
   acquiring information on a pattern defined based on the writing data;
   selecting a format of a plurality of formats having different number of bits to be used, based on acquired information on the pattern, for each predetermined region;
   converting data in the predetermined region defined by the writing data, by using a selected format; and
   storing converted data in the predetermined region.

7. The method according to claim 6, wherein the format is selected based on at least one piece of pattern information of a figure type, number of figures, and a figure size.

8. The method according to claim 6 wherein, in the converted data in the predetermined region, an identifier for identifying the format used for converting is defined.

9. The method according to claim 8, wherein the format is selected based on at least one piece of pattern information of a figure type, number of figures, and a figure size.

10. The method according to claim 6, wherein the format is selected so that number of bits to be used by the converted data in the predetermined region is to be fewer.

* * * * *